United States Patent
Alers et al.

(10) Patent No.: US 6,320,479 B1
(45) Date of Patent: Nov. 20, 2001

(54) MAGNETOSTRICTIVE SURFACE ACOUSTIC WAVE DEVICES HAVING OPTIMIZED TRANSDUCERS

(75) Inventors: Glenn B. Alers, Santa Cruz, CA (US); Kenneth Alexander Ellis, North Plainfield, NJ (US); Timothy J. Klemmer, Sharpsburg, PA (US); Robert Bruce Van Dover, Maplewood, NJ (US)

(73) Assignee: Agere Systems Optoelectronics Guardian Corp., Orlando, FL (US)

( * ) Notice: Subject to any disclaimer, the term of this patent is extended or adjusted under 35 U.S.C. 154(b) by 0 days.

(21) Appl. No.: 09/464,805

(22) Filed: Dec. 17, 1999

Related U.S. Application Data

(63) Continuation-in-part of application No. 09/137,431, filed on Aug. 21, 1998, now Pat. No. 6,046,657.

(51) Int. Cl.[7] .................... H03H 9/135; H03H 9/62; H01L 41/06; H01L 41/12
(52) U.S. Cl. ............... 333/154; 333/148; 333/196; 333/201; 310/26
(58) Field of Search ................... 333/154, 150, 333/193, 194, 195, 196, 201, 148, 149; 310/311, 26, 313 R, 313 B, 313 A, 313 C

(56) References Cited

U.S. PATENT DOCUMENTS

| | | | |
|---|---|---|---|
| 4,137,470 | * | 1/1979 | Désormière et al. ............ 310/26 |
| 4,177,438 | * | 12/1979 | Vittoria ........................... 333/152 |
| 4,199,737 | * | 4/1980 | Patteson et al. ................. 333/154 |
| 4,716,390 | * | 12/1987 | Elliott et al. .................... 333/202 |
| 5,260,615 | * | 11/1993 | Sahashi et al. .............. 333/201 X |
| 6,046,657 | * | 4/2000 | Alers et al. ..................... 333/150 |

FOREIGN PATENT DOCUMENTS

| | | | |
|---|---|---|---|
| 54-53939 | * | 4/1979 | (JP) ............................... 333/201 |
| 54-53941 | * | 4/1979 | (JP) ............................... 333/201 |

* cited by examiner

*Primary Examiner*—Robert Pascal
*Assistant Examiner*—Barbara Summons
(74) *Attorney, Agent, or Firm*—Lowenstein Sandler PC

(57) ABSTRACT

In accordance with the invention, magnetostrictive saw devices are provided with improved transducer structures for enhanced performance. In one improved device, the transducers are in the form of gratings with interconnected ends for reduced resistance and inductance. In another embodiment, the transducers are shaped to provide apodization. In yet a third embodiment, transducer performance is enhanced by patterning composite structures.

7 Claims, 3 Drawing Sheets

MAGNETOSTRICTIVE SURFACE ACOUSTIC WAVE DEVICES HAVING OPTIMIZED TRANSDUCERS

CROSS REFERENCE TO RELATED APPLICATIONS

This application is a continuation-in-part of U.S. patent application Ser. No. 09/137,431, now U.S. Pat. No. 6,046,657 filed by Glenn B. Alers et al. on Aug. 21, 1998 and entitled "Magnetostrictive Acoustic Wave Device and Microelectronic Circuit Including Same", which is incorporated herein by reference.

FIELD OF THE INVENTION

This invention relates to magnetostrictive surface acoustic wave (SAW) devices and, in particular, to magnetostrictive SAW devices provided with improved transducers for enhanced performance.

BACKGROUND OF THE INVENTION

SAW devices are important components in RF circuits, especially in wireless communication devices. SAW devices are particularly important as delay elements. They provide low-velocity, non-dispersive propagation with low attenuation up to microwave frequencies and a propagation path which is accessible at a substrate surface.

While conventional SAW devices are not readily integrated into silicon microelectronic circuits, applicants' above-referenced U.S. application Ser. No. 09/137,431 describes magnetostrictive SAW devices which can be fabricated on silicon substrates. These devices can be integrated with microelectronic circuits useful in wireless communications.

In essence, a magnetostrictive SAW device comprises a substrate, a film of an appropriate magnetostrictive material disposed on the substrate, an input transducer for generating horizontally polarized shear waves along the film and an output transducer for receiving the shear waves. The substrate can comprise silicon and include one or more microelectronic circuit elements interconnected with the magnetostrictive SAW device. The transducers are typically serpentine (meander-type) electrodes.

The present invention provides devices of this type with improved transducer structures for enhanced performance.

SUMMARY OF THE INVENTION

In accordance with the invention, magnetostrictive saw devices are provided with improved transducer structures for enhanced performance. In one improved device, the transducers are in the form of gratings with interconnected ends for reduced resistance and inductance. In another embodiment, the transducers are shaped to provide apodization. In yet a third embodiment, transducer performance is enhanced by patterning composite structures.

BRIEF DESCRIPTION OF THE DRAWINGS

The advantages, nature and various additional features of the invention will appear more fully upon consideration of the illustrative embodiments described in connection with the accompanying drawings. In the drawings.

It should be understood that these drawings are for purposes of illustrating the concepts of the invention and are not to scale.

DETAILED DESCRIPTION

Figure 1:
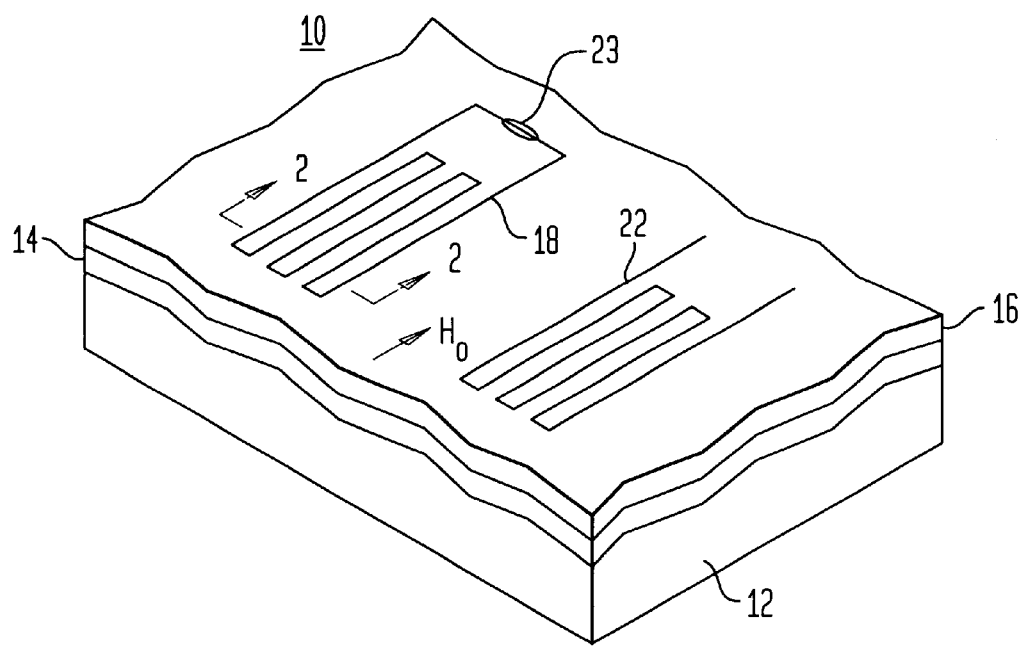
FIG. 1 is a perspective view of a SAW device using conventional transducers.

Referring to the drawings, FIG. 1 is a perspective view of a magnetostrictive SAW device 10 using conventional transducers 18 and 22. The device 10 typically comprises a substrate 12 coated with a thin film 14 of magnetostrictive material followed by a film 16 of insulating material. An input magnetoelastic transducer 18, typically in the form of a serpentine conductor, is disposed on a first region of insulating film 16, and a similar output transducer 22 is disposed on a second region of film 16 for receiving acoustic waves propagated from input transducer 18. The transducers each comprise a conductor with periodic discrete excursions perpendicular to the direction of surface wave propagation.

Application of an oscillatory electrical signal to the ends of input transducer 18 generates, through the magnetostrictive response of film 14, shear acoustic waves in both film 14 and substrate 12. These waves propagate within both film 14 and substrate 12 from the first region to the second region where they produce a corresponding oscillatory electrical signal in output transducer 22.

In typical devices, the thin film 14 of magnetostrictive material has a thickness in the range 0.1–1.0 μm and the insulating film 16 has a thickness of about 0.1–1.0 μm. Suitable magnetostrictive materials include polycrystalline ferromagnetic alloys such as $Ni_xFe_{1-x}$, preferably with $0.4<x<0.6$ or $0.15<x<0.25$ and $Co_xFe_{1-x}$, preferably with $0.3<x<0.7$; amorphous ferromagnetic alloys of Fe and/or Co with early transition metals such as $Co_{1-x-y}Ta_xZr_y$, preferably with $0.01<x<0.15$ and $0.01<y<0.15$, and $Co_{1-x-y}Nb_xZr_y$, preferably with $0.01<x<0.15$ and $0.01<y<0.15$; amorphous ferromagnetic alloys of Fe and/or Co with metalloids such as $Fe_{1-x-y}Co_xP_y$, preferably with $0.01<x<0.7$ and $0.05<y<0.2$; and rare-earth transition-metal ferromagnetic alloys such as $Tb_xDy_{1-x}Fe_y$, preferably with $0.2<x<0.3$ and $1.9<y<2.1$. Ferromagnetic oxides, such as $NiFe_2O_4$, $(NiZn)Fe_2O_4$, and $Fe_3O_4$, can also be used for the thin film 14. Since these oxides are insulating, they permit omission of the insulating film 16.

In the SAW device described in the parent application Ser. No. 09/137,431, the substrate 12 comprises a silicon substrate including at least one microelectronic circuit 23, and the in put transducer, the output transducer or both are coupled to the microeletronic circuit. In such arrangements, the SAW device 10 provides non-dispersive, low-loss delay particularly useful in wireless communication circuits. Further details concerning the structure and operation are set forth in the above-identified application.

Figure 2A:
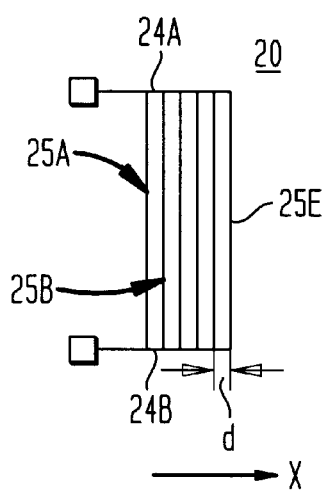
FIGS. 2(a) and 2(b) are schematic views of improved transducers having comb or interconnected grid configurations.
Figure 2B:
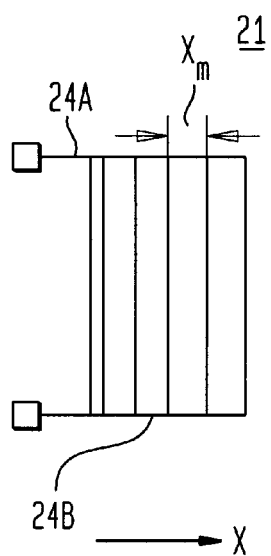

The present invention is directed to SAW devices provided with improved transducers for enhanced performance. FIGS. 2(a) and 2(b) are schematic views of two different improved transducers having a comb configuration. As distinguished from a conventional serpentine transducer, a comb structure transducer, comprises a grid (array) of parallel electrodes, and the respective ends of the electrodes are interconnected. Thus, for example, the improved transducer 20 of FIG. 2(a) comprises a plurality of parallel conductive grid conductors 25A and 25B, . . . , 25E extending transversely between longitudinal conductors 24A and 24B. Thus the top ends of the grid electrodes are connected by 24A and the bottom ends by 24B. The grid conductors are transverse to the direction of acoustic wave propagation. In the unchirpped transducer embodiment of FIG. 2(a), the grid lines are equally spaced by a distance d which is advantageously given by:

$$d = v/f \quad \text{(Eq. 1)}$$

where v is the acoustic velocity of the substrate and f is the desired resonant frequency of the device.

FIG. 2(b) illustrates a second comb structure transducer 21 adapted to produce a magnetostrictive SAW device apodized by chirping. Here the spacing $x_n$ between consecutive transverse conductive grid lines is a function of the distance x along the propagation direction. Advantageously $x_n$ varies linearly with x. The advantage of the comb structure transducer, as compared with the conventional serpentine transducer, is substantially reduced resistance and inductance.

The device can be apodized by varying the transducer grid conductor spacing $x_n$ with x (as shown in FIG. 2B), by varying the element length $A_n$, or by varying both $x_n$ and $A_n$. The frequency response of the device, denoted by $R_c(f)$, is given by:

$$R_c(f) = \sum_{n=-(N-1)/2}^{+(N-1)/2} A_n \exp\left(-2\pi j \frac{f x_n}{v}\right) \quad \text{(Eq. 2)}$$

Where $f$ is frequency, and N is the number of elements in the transducer, and $R_c$ is given in arbitrary units. This expression is approximate. It ignores second-order effects, such those caused by reflection of the acoustic wave, interactions between elements, and the finite size of the elements.

Figure 3A:
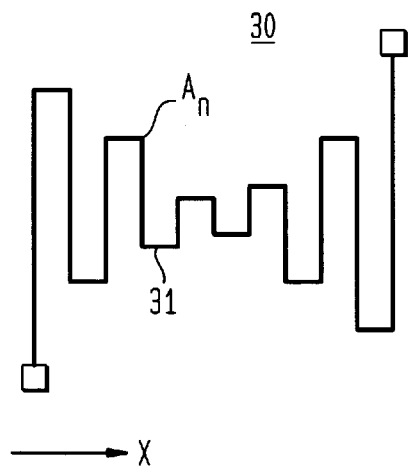
FIGS. 3(a) and 3(b) are schematic views of improved transducers for an apodized SAW device.
Figure 3B:
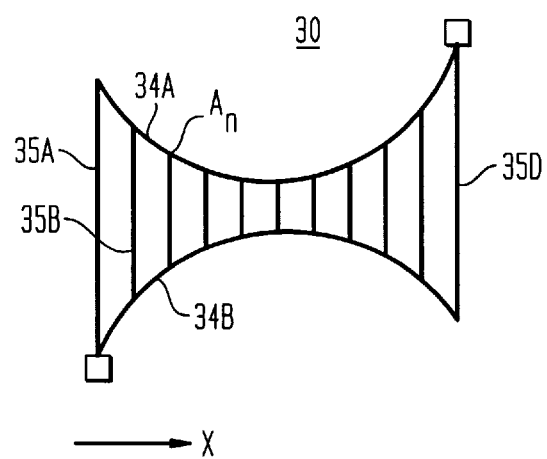

FIGS. 3(a) and 3(b) are schematic views of alternative transducers for apodized SAW devices. FIG. 3(a) shows an apodized transducer 30 comprising a serpentine conductor 31 with periodic excursions transverse to the direction x of wave propagation. In contrast with the conventional serpentine transducers, the amplitudes $A_n$ of the periodic excursions vary as a function of x. The excursion amplitudes start off large, diminish with increasing x and then again become large.

FIG. 3(b) shows a comb structure transducer 32 apodized by variation of element length. Here the longitudinal conductors 34A and 34B are no longer parallel but rather extend generally in the direction x of wave propagation. The transverse conductive grid lines 35A, 35B, . . . , 35D are preferably equally spaced, but their lengths $A_n$ vary with x in a manner similar to that shown in FIG. 3(a).

Figure 4A:
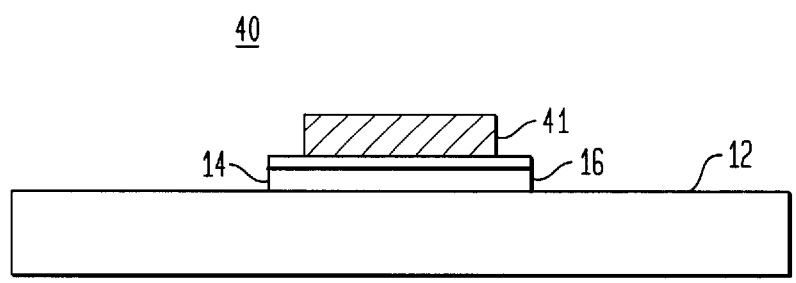
FIGS. 4(a) 4(b) and 4(c) are schematic cross sections of improved patterned layer transducers.
Figure 4B:
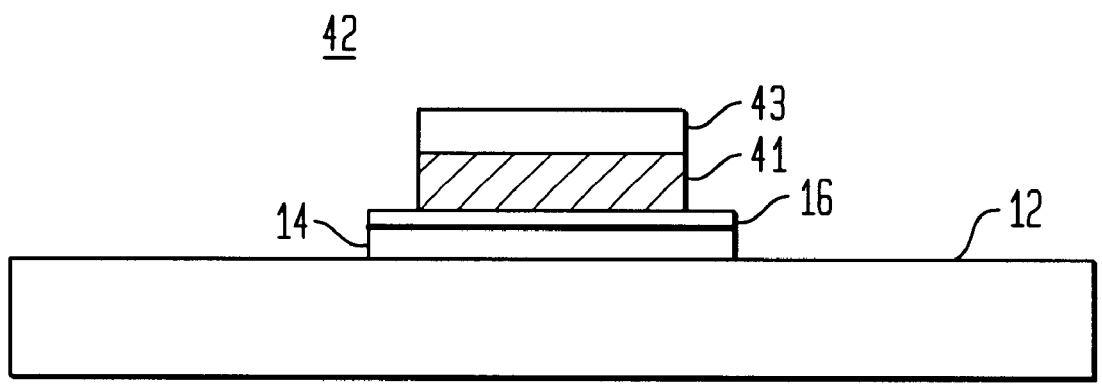
Figure 4C:
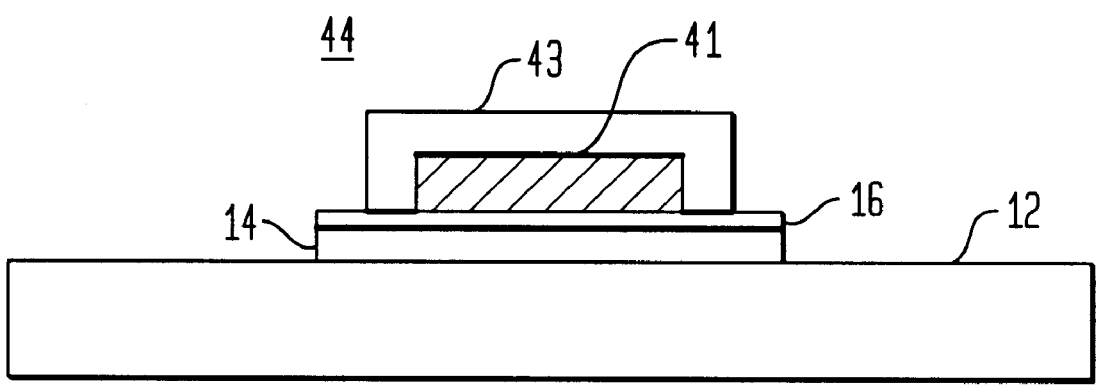

FIGS. 4(a), 4(b) and 4(c) are schematic cross sections of improved transducer structures utilizing multiple configured layers. In the FIG. 4(a) transducer 40 the insulating and magnetostrictive films 16, 14, rather than continuously covering the substrate surface, are patterned similar to the configuration of the overlying conductor 41. Patterning the magnetostrictive film is advantageous in that it reduces direct coupling between transducers. Such direct coupling, either capacitive or through a direct ohmic contact, is undesirable in that it reduces the device's ability to filter out unwanted frequency components. Furthermore, such patterning, in combination with an insulating substrate, eliminates the need for the insulating layer 16.

FIG. 4(b) shows an alternative transducer 42 wherein not only are the insulating and magnetostrictive films patterned, but also a film of magnetic material 43 overlies the transducer conductors and is patterned in a configuration similar to the conductors. The magnetic film and the transducer conductors can be patterned together using conventional photolithographic techniques.

FIG. 4(c) is an alternative transducer 44 where the magnetic material 43 and the magnetostrictive material 14 essentially surround the transducer conductor 41. Here the conductor is patterned first, then the overlying magnetic film is deposited and patterned.

The overlying magnetic layer 43 is advantageously a soft magnetic material having a relatively small uniaxial anisotropy. The anisotropy should be as low as possible consistent with a ferromagnetic resonance frequency above the desired frequency of operation. The overlying magnetic layer 43 can be a magnetostrictive material to increase the magnetostrictive response.

In the embodiments of FIGS. 4(b) and 4(c), the overlying magnetic film 43 reduces the magnetic reluctance of the magnetic circuit surrounding the conductor, thereby increasing the flux level in the magnetostrictive material and thus the magnetostrictive response.

The invention can now be better understood by consideration of the following specific examples:

EXAMPLE 1

An exemplary device of the type shown in FIG. 4(a) can comprise an insulating a substrate 12 of silicon, a magnetostrictive layer 14 of sputtered CoFeTaZr (46%, 46%, 3%, 5%) alloy (CFTZ) (typically about 250 nm thick) an insulating layer 16 of sputtered SiO2 (typically about 500 nm thick), and a conductive layer of evaporated Al (typically 1 micrometer).

EXAMPLE 2

An exemplary device of the type shown FIG. 4(b) can comprise substrate 12 of borosilicate glass (typically 0.4 mm), magnetostrictive layers 14 and 43 of sputtered CFTZ (each typically 250 nm) and a conductive layer 41 of sputtered copper (typically 500 nm). No insulating layer 16 need be used.

It is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention.

What is claimed is:

1. In a magnetostrictive surface acoustic wave device comprising a substrate, a layer of magnetostrictive material disposed on the substrate, an input transducer for generating surface acoustic waves on the device and an output transducer, spaced from the input transducer, for receiving the surface acoustic waves, at least one of the transducers comprising an array of grid conductors extending transverse to the direction of acoustic wave propagation, each grid conductor having a first end and a second end;

a conductor connecting the first ends of the grid conductors;

a conductor connecting the second ends of the grid conductors; and wherein the grid conductors are spaced apart by distances which vary along the direction of acoustic wave propagation to produce an apodized device.

2. The device of claim 1 wherein in the transducer the distances vary linearly along the direction of acoustic wave propagation.

3. The device of claim 1 wherein in the transducer the grid conductors comprise a plurality of parallel linear conductors.

4. In a magnetostrictive surface acoustic wave device comprising a substrate, a layer of magnetostrictive material disposed on the substrate, an input transducer for generating surface acoustic waves on the device and an output transducer, spaced from the input transducer, for receiving the surface acoustic waves, at least one of the transducers comprising an array of grid conductors extending transverse to the direction of acoustic wave propagation, each grid conductor having a first end and a second end;

a conductor connecting the first ends of the grid conductors;

a conductor connecting the second ends of the grid conductors; and wherein the magnetostrictive layer is patterned similar to the grid conductors.

5. The device of claim 4, the transducer further comprising a second magnetic layer overlying the grid conductors and patterned similar to the grid conductors.

6. The device of claim 5 wherein the second magnetic layer comprises a magnetostrictive layer.

7. The device of claim 4 wherein in the transducer the grid conductors comprise a plurality of parallel linear conductors.

\* \* \* \* \*